(12) United States Patent
Cobb et al.

(10) Patent No.: US 6,619,786 B2
(45) Date of Patent: Sep. 16, 2003

(54) TAB CIRCUIT FOR INK JET PRINTER CARTRIDGES

(75) Inventors: Brian Lee Cobb, Lexington, KY (US); Jeffrey Louis Sangalli, Shelbyville, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/876,909

(22) Filed: Jun. 8, 2001

(65) Prior Publication Data

US 2002/0185482 A1 Dec. 12, 2002

(51) Int. Cl.[7] .............................. B41J 2/14; B41J 2/16; B41J 2/05; H05K 3/34; B21D 53/00
(52) U.S. Cl. .............................. 347/50; 347/59; 29/840; 29/890.1
(58) Field of Search .............................. 347/50, 58, 64, 347/86, 87, 59; 29/611, 840, 843, 890.1

(56) References Cited

U.S. PATENT DOCUMENTS

| | | | |
|---|---|---|---|
| 4,674,671 A | 6/1987 | Fister et al. | 228/111 |
| 5,034,591 A | 7/1991 | Fang | 219/121.69 |
| 5,194,695 A | 3/1993 | Maslakow | 124/52.4 |
| 5,278,584 A | 1/1994 | Keefe et al. | 347/63 |
| 5,297,331 A | 3/1994 | Childers | 29/611 |
| 5,300,959 A | 4/1994 | McClelland et al. | 347/47 |
| 5,420,627 A | 5/1995 | Keefe et al. | 347/87 |
| 5,442,384 A | 8/1995 | Schantz et al. | 347/20 |
| 5,568,171 A | 10/1996 | Keefe et al. | 347/58 |
| 5,594,481 A | 1/1997 | Keefe et al. | 347/65 |
| 5,637,166 A | 6/1997 | Swanson et al. | 156/73.1 |
| 5,648,804 A | 7/1997 | Keefe et al. | 347/47 |
| 5,719,605 A * | 2/1998 | Anderson et al. | 347/59 |
| 5,736,998 A | 4/1998 | Caren et al. | 347/45 |
| 5,748,209 A | 5/1998 | Chapman et al. | 347/50 |
| 5,847,356 A | 12/1998 | Santhanam | 219/121.63 |
| 5,852,460 A | 12/1998 | Schaeffer et al. | 347/187 |
| 5,930,602 A | 7/1999 | Kinsman | 438/123 |
| 5,946,012 A | 8/1999 | Courian et al. | 347/63 |
| 5,984,464 A | 11/1999 | Steinfield et al. | 347/87 |
| 6,043,108 A | 3/2000 | Izumi et al. | 438/111 |
| 6,062,679 A | 5/2000 | Meyer et al. | 347/45 |
| 6,075,283 A | 6/2000 | Kinsman et al. | 257/676 |

* cited by examiner

Primary Examiner—Thinh Nguyen
Assistant Examiner—Juanita Stephens
(74) Attorney, Agent, or Firm—Frederick H. Gribbell; Jacqueline M. Daspit

(57) ABSTRACT

An improved TAB circuit is provided for use with ink jet printer cartridges, which carries electrical signals to an array of nozzles on a heater chip. The TAB circuit eliminates bent or broken electrical circuit traces before being bonded to the heater chip by creating a chip window that partially overlaps the edges of the heater chip, and by bringing the electrical circuit traces to the chip window and terminating these circuit traces at a PI (polyimide) edge, which defines the inner perimeter of the chip window. The circuit traces thus are not unsupported at their ends before being assembled to the heater chip, and are automatically correctly positioned to make contact with bond pads of the heater chip when the overall TAB circuit is in correct registration therewith. The TAB circuit also provides an improved tolerance for a covercoat placement that will tend to prevent corrosive ink from coming into contact with these metal traces. The chip window of the TAB circuit also allows for a separate nozzle plate to be assembled to the heater chip.

14 Claims, 8 Drawing Sheets

TAB CIRCUIT FOR INK JET PRINTER CARTRIDGES

TECHNICAL FIELD

The present invention relates generally to ink jet printers and is particularly directed to a TAB circuit of the type which carries electrical signals to an array of nozzles on a heater chip. The invention is specifically disclosed as a TAB circuit that eliminates bent or broken electrical circuit traces before being bonded to the heater chip, while also providing a window for the nozzle plate.

BACKGROUND OF THE INVENTION

TAB (Tape Automated Bonding) circuit technology has been used as the primary interconnect device between the heater chip of ink jet printers and the printer main body for many years. Conventional TAB circuits are comprised of a substrate material, usually polyimide, with some form of metallization on the substrate that forms electrical circuits. There are many patents that disclose the use of TAB circuits with ink jet printers, and most of these patents are owned by Hewlett-Packard Company of Palo Alto, Calif.

One example patent owed by Hewlett-Packard is U.S. Pat. No. 5,300,959, by McClelland. McClelland discloses a nozzle member for an ink jet printer cartridge that uses a flexible polymer tape (i.e., the TAB circuit) and affixes that tape to a substrate that contains the heating elements that create the droplets that jet forth from the nozzles. Electrical conductors that provide pathways for electrical signals to the substrate are located on the flexible polymer tape and, through an opening (or "via"), make a connection to the substrate "electrodes." The vias are on the back side of the tape and face the conductive portions (i.e., electrodes) of the substrate.

McClelland's FIG. 8 illustrates a partial cross-section of portions of the TAB circuit where it interfaces to the substrate. FIG. 1 herein discloses a cross-section of a similar area of the TAB circuit interface to the substrate, but from a different angle. In FIG. 1 herein, the TAB circuit is generally designated by the reference numeral 10. The polyimide layer is designated by the reference numeral 12, and is made of a material manufactured by DuPont that is also known as KAPTON®. A metal pathway or "trace" is provided from the left-hand side of FIG. 1 at the reference numeral 14. A similar electrical pathway or trace arrives from the right-hand side of FIG. 1 at the reference numeral 16. On the opposite side of the metal traces 14 and 16 is another layer of material at 18. This layer of material 18 is either a covercoat material, or another layer of the polyimide or KAPTON material, and which insulates and covers the metal traces 14 and 16 in the direction that faces the substrate.

The substrate itself is designated by reference numeral 20 on FIG. 1, and includes the resistive heating elements and "electrodes" that make up what is commonly known as a "heater chip." Two of the electrical pathways or electrodes are at the reference numerals 22 and 24, and two of the resistive heating elements are at the reference numerals 26 and 28. For example, the electrical signal that arrives at the electrode 22 could travel through a metal trace or pathway (not shown on FIG. 1) to connect to the heating resistor 26, and when energized by a sufficient electrical power level, the heating resistor 26 will cause a droplet of ink to be spurted out through a nozzle opening at 34 in the TAB circuit 10. Continuing this example, the electrode 24 could be connected using metal pathways or traces to the other heating resistive element on FIG. 1 at 28. When a sufficiently powerful electrical signal arrives at the heating resistor 28, this will cause a droplet of ink to be spurted out through a nozzle opening 36 in the TAB circuit 10.

The electrical connection between the metal trace 14 and the "electrode" 22 is created by a via or opening 30 in the covercoat layer 18 of the TAB circuit 10. This via must be filled with some type of electrically conductive substance, which could be a conductively filled polymer. Or perhaps a reflow soldering method could be used, or even an ultrasonic welding procedure. In a similar manner, an electrical connection can be made between the trace 16 and the "electrode" 24 through the via 32 in the covercoat layer 18 of the TAB circuit 10.

In the McClelland patent as illustrated in FIG. 1 herein, there is no separate nozzle plate (or "orifice plate") that forms the nozzle openings of most conventional ink jet cartridges. Instead, the TAB circuit 10 itself covers the entire nozzle area, including the middle area 38 between the nozzles 34 and 36.

For example, U.S. Pat. No. 5,278,584 (by Keefe) discloses an ink jet printhead that has improved ink flow paths between the ink reservoir and vaporization chambers. FIGS. 3 and 4 of Keefe illustrate the structure of the electrically conductive leads that are attached to the substrate. These conductive leads or traces are initially unsupported before being bonded to electrodes on the substrate. One advantage of the Keefe design is that the electrical traces that bring signals to the electrodes on the heater chip can all be temporarily run to a shorting bar (not shown) that can provide a single common electrode for an electroplating process for all of the circuit pathways of the TAB circuit itself. The McClelland design may not lend itself well for creating such a shorting bar. In Keefe, the shorting bar can be removed along with a portion of the polyimide material that creates a "chip window" in the nozzle area, and by which a nozzle plate can be installed through that chip window in the TAB circuit.

Conventional ink jet cartridges manufactured by Lexmark International, Inc. of Lexington, Ky. use a similar design to that disclosed in Keefe. One example of such similarity is the fact that the metal traces which carry electrical signals to the heater chip are initially unsupported at their terminal ends before a bonding procedure can be performed between the TAB circuit and the heater chip. Moreover, a "chip window" in the TAB circuit is created for installation of a nozzle plate, and also for the removal of the temporary shorting bar that provides an easy-to-access point used during the electroplating process of the metal traces of the TAB circuit itself. These unsupported circuit traces (also known as unsupported lead beams) extend into the chip window opening in the polyimide of the TAB circuit, and are later thermosonically bonded to metal contact pads on the heater chip. This chip window is formed by creating an internal edge through the polyimide that defines a closed perimeter, thereby forming a boundary (i.e., the internal edge).

FIG. 2 herein illustrates a portion of a TAB circuit used in a conventional Lexmark ink jet cartridge in the nozzle area. The polyimide material is generally designated by the reference numeral 50, and is cut or otherwise etched along an edge at 52 that creates an opening or chip window 74. This edge 52 will also be referred to herein as a "PI edge." As part of the artwork that makes up this TAB circuit, a relatively large plus sign ("+") is provided at 54 to aid in registration when mating the TAB circuit to the heater chip.

On FIG. 2, four different metalized circuit pathways or traces are illustrated at 60, 61, 62, and 63. These metal traces 60–63 each have an end point, designated respectively at the reference numerals 65, 66, 67, and 68. As can be easily seen on FIG. 2, these traces at their end points 65–68 terminate along a different line or plane than the PI edge 52. As also can easily be seen in FIG. 2, these traces 60–63 are initially unsupported, as they extend past the PI edge 52 into open space.

Also as part of the TAB circuit on FIG. 2 is a covercoat layer that is not visible in the figure, since it is on the opposite side of the TAB circuit. However, the edge of this covercoat layer is indicated by a hidden line at the reference numeral 70 on FIG. 2. This covercoat material extends over the metal traces, which affects the shape of the edge 70 as indicated at 72, as the edge 70 follows over the outline of the metal trace 61.

FIG. 3 shows a further step in the process of constructing an ink jet cartridge known in the prior art. This further step now includes the heater chip at 85, and also includes a nozzle plate at 95. The heater chip includes multiple bonding pads, such as those indicated by the reference numerals 80, 81, 82, and 83. On FIG. 3, these bonding pads 80–83 mate respectively to the unsupported lead beam ends of the traces 60–63. So long as the traces 60–63 have not been bent, the ends of the traces 65–68 will optimally match up to the physical locations of the bonding pads 80–83 when overall TAB circuit registration is correct with respect to the heater chip 85.

The nozzle plate 95 includes multiple openings or orifices, which are designated at the reference numerals 90, 91, 92, and 93. These nozzle openings 90–93 generally match up to heater elements on the heater chip 85, and these heater elements (not shown on FIG. 3) will generally match up to the electrical signals that are brought to the heater chip 85 by the metal traces 60–63. One advantage of using a separate nozzle plate 95 is that its registration with respect to the heater chip 85 is not dependent upon the registration of the TAB circuit 50 with respect to the same heater chip 85. Therefore, more accurate placement of the nozzle openings 90–93 can be made by the independent nozzle plate 95 (irrespective of the TAB circuit 50).

As noted above, the lead beams 60–63 extend into an opening in the polyimide of the TAB circuit, and are unsupported when they are shipped from the TAB circuit manufacturer. The delicate nature of the lead beams often results in bent leads in all three directions. Bent leads can occur during the actual circuit manufacturing, or later in the TAB circuit-to-heater chip attachment process. The result is higher scrap rates at the TAB circuit manufacturer, and lower yields and extra scrap at the ink jet cartridge manufacturing process. Of course, all of this scrap increases the cost of the TAB circuit and the ink jet cartridge manufacturing process.

Another shortcoming of the conventional manufacturing procedures and conventional design illustrated in FIGS. 2 and 3 is the location of the physical interface between the metal traces, the PI edge, and the covercoat material. One purpose of the covercoat material is to prevent the corrosive ink from contacting the metal traces. Due to the covercoat placement tolerances, however, there are occurrences when the ink reaches the metal traces at the interface, thereby leading to lead beam corrosion (of these traces). This does not automatically occur, but depending upon tolerances, there could be such an opportunity for corrosion. Lead beam corrosion can cause ink jet cartridge failure either marginally or catastrophically, and will potentially render the cartridge unreliable.

A typical method of fastening the TAB circuit 50 to the heater chip 85 is the use of thermosonic welding. Traditionally the unsupported lead beams of the TAB circuit are aligned to the individual bond pads of the heater chip so as to perform the assembly process. Since the lead beams 60–63 are unsupported and are independent members, a Video Lead Locator (VLL) inspection process is required to visually locate each lead beam so that all bent leads are identified and skipped prior to the thermosonic welding procedure. TAB circuits with bent leads are deemed unusable in the TAB bonding process and are scrapped. The VLL inspection process adds cycle time per circuit, and in some assembly equipment it requires more than three seconds of additional cycle time per circuit.

The traditional TAB bonding process inherently must accept the variation in the location of the unsupported lead beams. The fact that the traditional TAB circuit has potential variation in the exact x, y, and z locations of the independent lead beams creates additional variability in the TAB bonding process, and ultimately affects the quality of the thermosonic welds. The quality of the thermosonic welds is typically measured by destructive pull force testing, or by destructive shear testing methods at the weld joint. An off-location lead beam typically has a reduced weld strength and typically produces a lower pull force or shear force to separate the lead beam from the bond pad on the heater chip.

It would be an improvement to provide a TAB circuit that eliminated the unsupported lead beams that bring the electrical signals to the heater chip, and also that would tend to eliminate the possibility of corrosive ink coming into contact with the metal circuit traces (i.e., the lead beams) that carry these important signals to the heater chip.

SUMMARY OF THE INVENTION

Accordingly, it is an advantage of the present invention to provide a TAB circuit that provides a polyimide edge to create a chip window for a nozzle plate, in which the metal circuit traces are not unsupported at their ends where they make contact with bond pads of a heater chip. It is another advantage of the present invention to provide TAB circuit that provides an improved tolerance for a covercoat placement that will tend to prevent corrosive ink from coming into contact with the metal traces that carry the electrical signals to the heating elements of the heater chip.

Additional advantages and other novel features of the invention will be set forth in part in the description that follows and in part will become apparent to those skilled in the art upon examination of the following or may be learned with the practice of the invention.

To achieve the foregoing and other advantages, and in accordance with one aspect of the present invention, a tape automated bonding circuit for a printer cartridge is provided, which includes a flexible substrate having a first surface and a second surface and comprised of electrically insulating material, in which a plurality of electrically conductive traces are affixed to the first surface of the flexible substrate. The flexible substrate includes a chip window opening that is formed between the first and second surfaces by an internal edge in the flexible substrate that defines a closed perimeter. At least a subset of the plurality of electrically conductive traces forms pathways that terminate substantially adjacent to the internal edge.

In accordance with another aspect of the present invention, a method is provided for assembling a tape automated bonding circuit used in a printer cartridge, including: (a) providing a flexible substrate comprised of electrically insulating material, and a plurality of electrically conductive traces that are affixed to a first surface of the flexible substrate. The flexible substrate includes a chip window opening that is formed in the first surface by an internal edge in the flexible substrate that defines a closed perimeter, and at least a subset of the plurality of electrically conductive traces forms pathways that terminate substantially adjacent to the internal edge; (b) providing a heater chip that exhibits a plurality of bond pads along at least one edge of the heater chip, in which the heater chip contains a plurality of resistive heating elements. An inner dimension formed by at least one of a length or a width of the chip window is smaller in linear distance than an outer dimension formed by at least one of a length or a width of a surface of the heater chip; (c) aligning the heater chip and the flexible substrate-using at least one registration mark on the flexible substrate but without the use of a video lead locator inspection tool to detect bent leads-so that the end of the pathways of the at least a subset of the plurality of electrically conductive traces comes into close proximity to the plurality of bond pads along the at least one edge of the heater chip, such that a portion of the flexible substrate overlaps a portion of the surface of the heater chip along the at least one edge of the heater chip; and (d) bonding the plurality of bond pads to corresponding of the at least a subset of the plurality of electrically conductive traces.

In accordance with a further aspect of the present invention, a method is provided for partially assembling a tape automated bonding circuit used in a printer cartridge, including: (a) providing a flexible substrate comprised of electrically insulating material, and a plurality of electrically conductive traces that are affixed to a first surface of the flexible substrate. The flexible substrate includes a chip window opening that is formed in the first surface by an internal edge in the flexible substrate that defines a closed perimeter, and at least a subset of the plurality of electrically conductive traces forms pathways that terminate substantially adjacent to the internal edge; (b) providing a heater chip that exhibits a plurality of bond pads along at least one edge of the heater chip, in which the heater chip contains a plurality of resistive heating elements. An inner dimension formed by at least one of a length or a width of the chip window is smaller in linear distance than an outer dimension formed by at least one of a length or a width of a surface of the heater chip; (c) aligning the heater chip and the flexible substrate—using at least one registration mark on the flexible substrate but without the use of a video lead locator inspection tool to detect bent leads—so that the end of the pathways of the at least a subset of the plurality of electrically conductive traces comes into close proximity to the plurality of bond pads along the at least one edge of the heater chip, such that a portion of the flexible substrate overlaps a portion of the surface of the heater chip along the at least one edge of the heater chip; and (d) applying an adhesive material between the flexible substrate and the heater chip at locations in a support web area of the flexible substrate where it overlaps at least a portion of the surface of the heater chip along the at least one edge of the heater chip, thereby tacking the flexible substrate to the heater chip in an aligned position to create a sub-assembly that can be permanently electrically connected in a subsequent procedure.

Still other advantages of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Reference will now be made in detail to the present preferred embodiment of the invention, an example of which is illustrated in the accompanying drawings, wherein like numerals indicate the same elements throughout the views.

Figure 4:
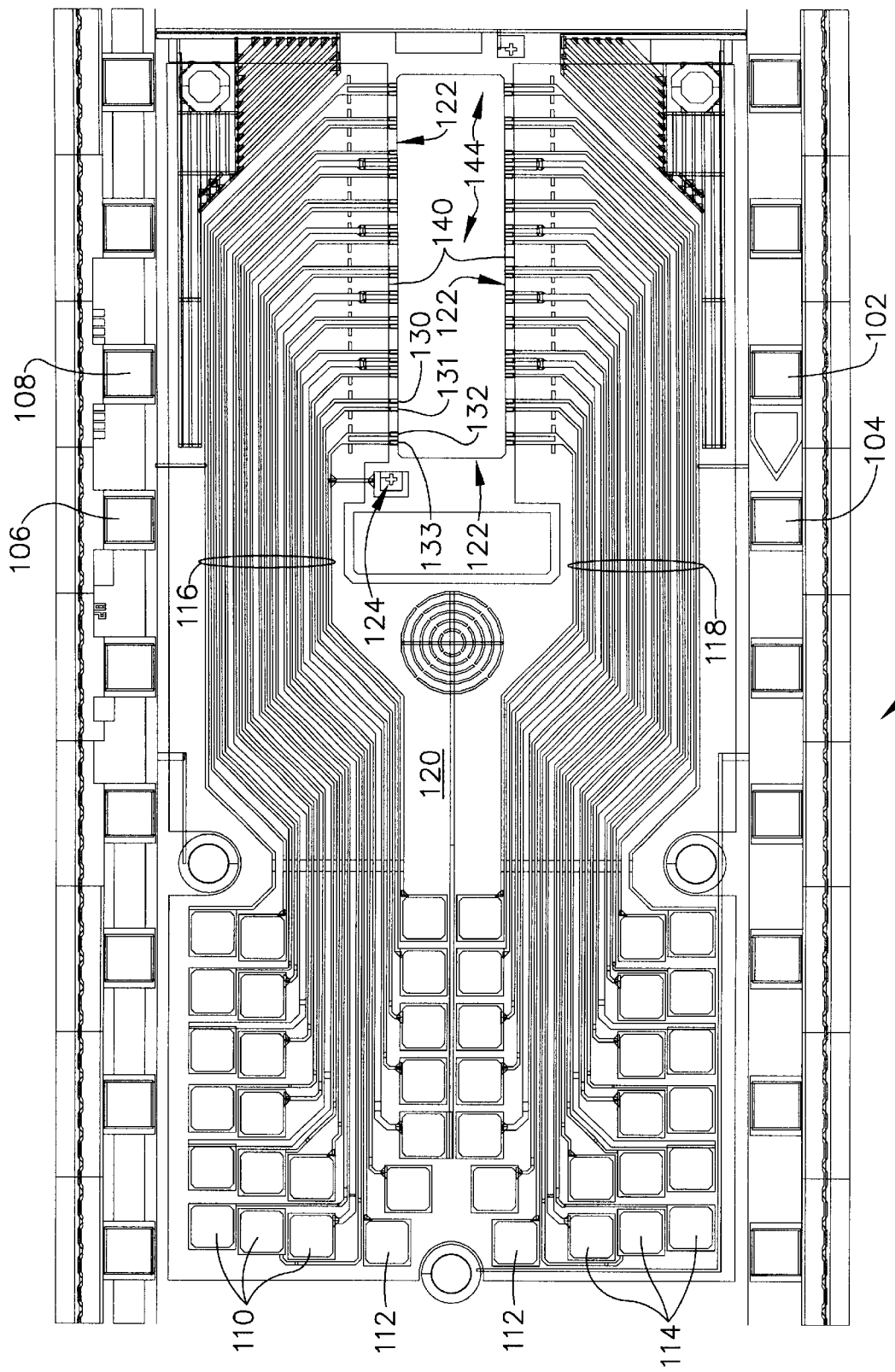
FIG. 4 is a plan view of a TAB circuit in its entirety, as designed and constructed according to the principles of the present invention.

Referring now to FIG. 4, a TAB circuit generally designated by the reference numeral 100 is illustrated in its entirety, and is of an improved design as according to the principles of the present invention. Along the outer edges of the TAB circuit are square windows 102, 104, 106, and 108, which are used to advance the tape-like structure of the TAB circuit during the manufacturing process. In many ways, the TAB circuit has the appearance of photographic film, which also uses such square openings or windows that mate with a drive sprocket to advance film through a camera.

Along the bottom edge as seen on FIG. 4, the TAB circuit 100 has a large number of conductive connector pads, basically divided into three groups: a first group on the left side of the figure is depicted at the reference numerals 110, a second group essentially in the middle of the circuit is depicted at the reference numerals 112, and a third group is depicted along the right side of FIG. 4 at the reference numerals 114. These connecting pads 110, 112, and 114 are made relatively large so as to make it easy to target an external set of electrical conductors to be soldered or otherwise connected to these pads. It will be understood that the drawing artwork of FIG. 4 is magnified quite a bit, and the actual TAB circuit 100 is much smaller than depicted in this illustration.

The main substrate 120 of the TAB circuit is the polyimide material, and the multiple electrical conductive traces are depicted in two halves as they run vertically from the contact pads 110, 112, and 114 up to a chip window, which is illustrated at 144 on FIG. 4. These conductive traces are quite small in size and are both narrow and closely spaced in the areas illustrated at the reference numerals 116 (for the left-hand group on FIG. 4) and at 118 (for the right-hand group on FIG. 4). Some of the conductive traces in the grouping at 116 become the conductive traces 130–133 that are illustrated in greater detail on FIGS. 5 and 6, as discussed below.

A registration mark at 124 is apparent on FIG. 4, which is near the left bottom corner of the chip window 144. The rectangular chip window itself at 144 is defined by an internal polyimide edge (or "PI edge"), which is outlined at the reference numerals 122. This PI edge 122 forms a closed perimeter, and is in many ways equivalent to the prior art PI edge 52 illustrated in FIGS. 2 and 3, although the PI edge 122 is in a different location.

Figure 1:
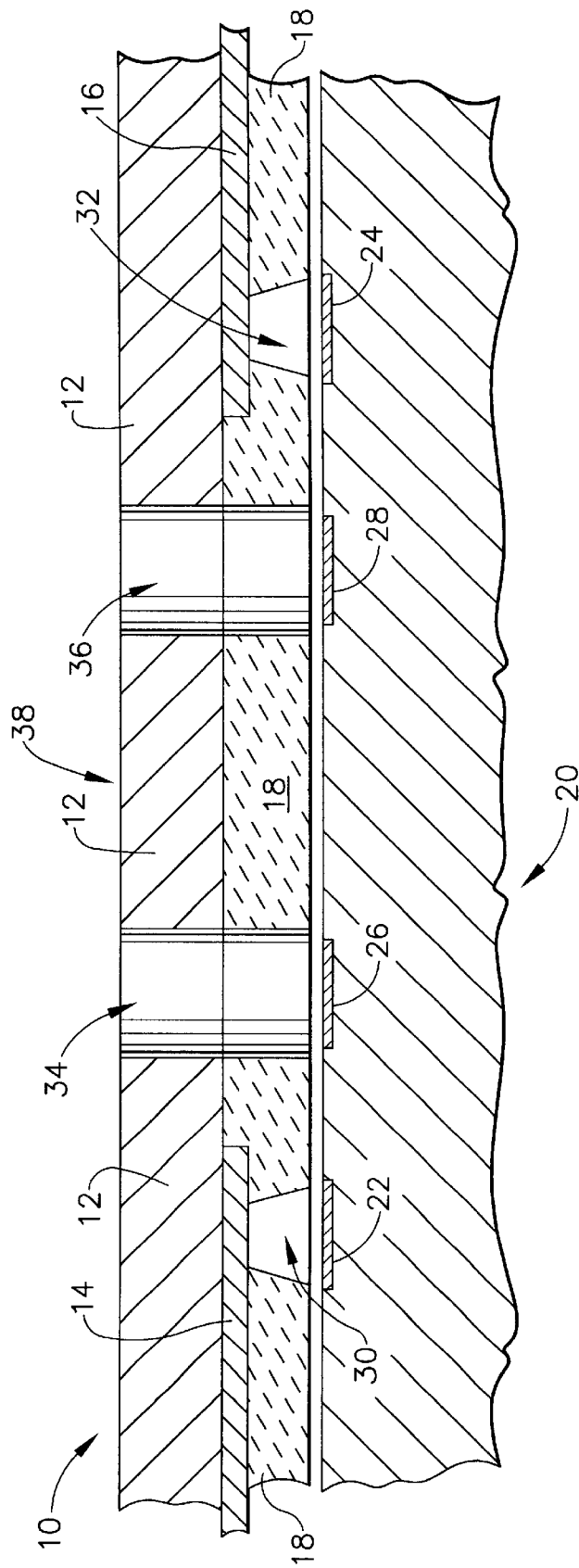
FIG. 1 is an elevational view in cross-section of a portion of a prior art TAB circuit where it is bonded to a heater chip, in which there is no separate nozzle plate.
Figure 2:
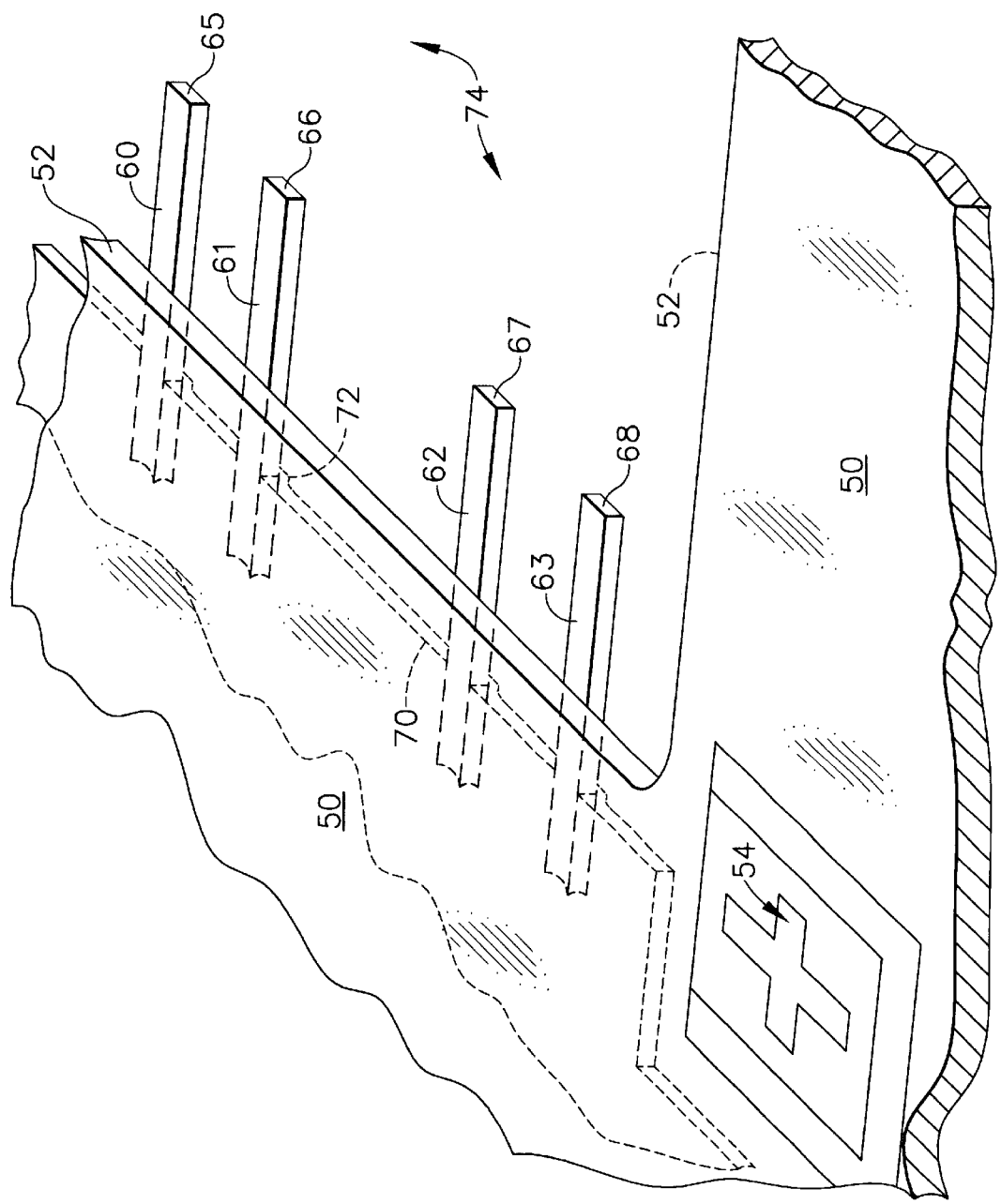
FIG. 2 is a perspective view of a conventional TAB circuit that illustrates a portion of the chip window, and indicates the relative positions of the polyimide edge and the unsupported lead beam ends of the conductive traces, as is known in the prior art for ink jet cartridges.
Figure 3:
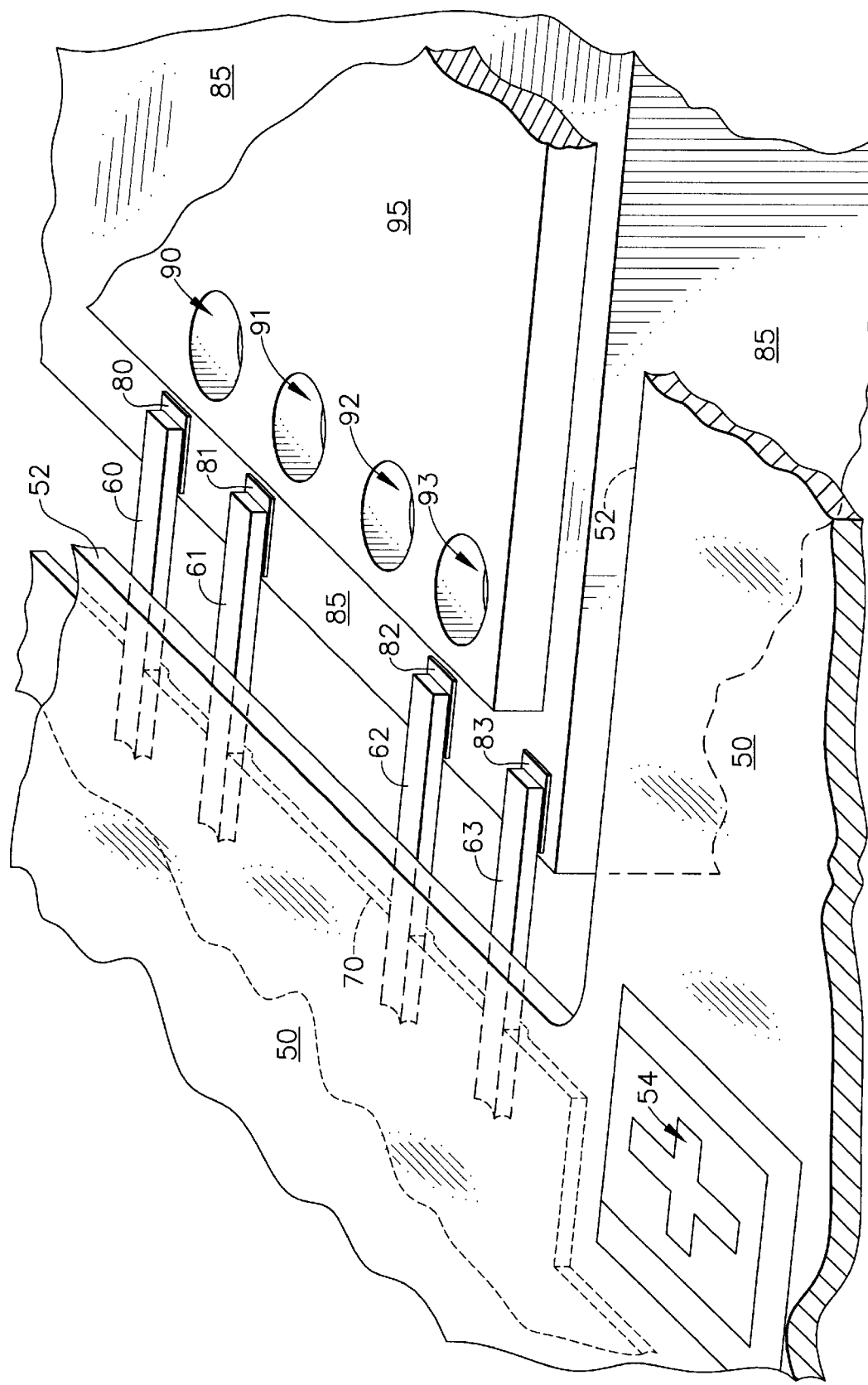
FIG. 3 is a perspective view of the TAB circuit of FIG. 2 at a later assembly stage, after a heater chip and nozzle plate have been assembled to the unsupported lead ends of the metallic traces of the TAB circuit, as is known to the prior art.

As described in reference to the prior art TAB circuit illustrated in FIGS. 2 and 3, it is preferred to place a covercoat over the surface of the TAB circuit 100 on the side that includes the electrically conductive traces. The edge of this covercoat near the chip window 144 is illustrated at 140, and this edge 140 of the covercoat preferably is manufactured to within a certain tolerance that is referenced to the PI edge 122. In this manner, the distance between the PI edge 122 and the covercoat edge 140 should be fairly tightly controlled.

Figure 5:
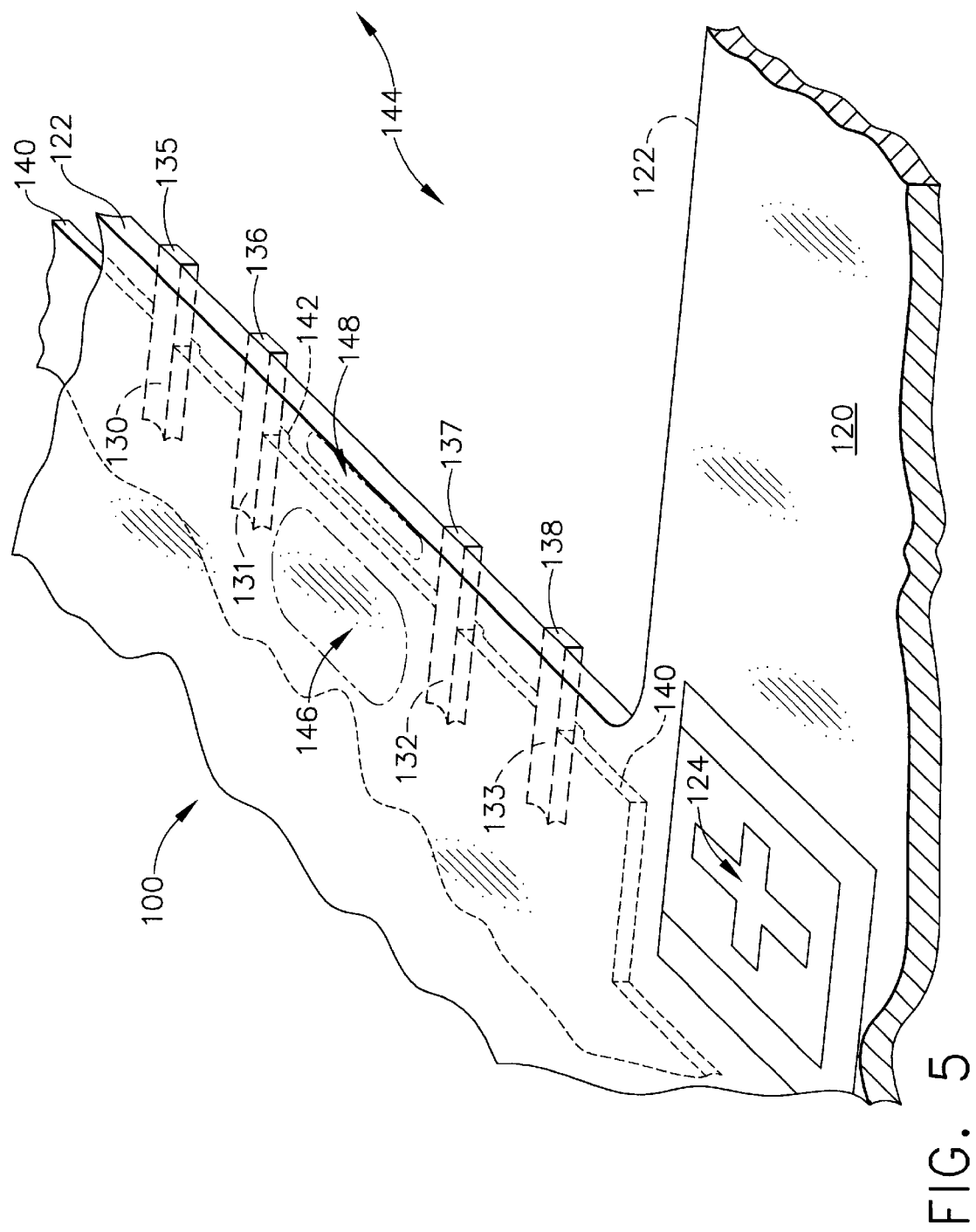
FIG. 5 is a perspective of a portion of the TAB circuit of FIG. 4, showing an area near the chip window, which shows details of the polyimide edge that lines up with the lead beam ends of the metallic traces of the TAB circuit.

On FIG. 5, a portion of the TAB circuit 100 is shown near the chip window 144. The polyimide material 120 is clearly seen, and it is cut out along the PI edge at 122, in a similar manner to that illustrated in FIG. 2. In addition, the registration mark at 124 is visible on FIG. 5, which is similar to the registration mark 54 on FIG. 2.

One important difference about FIG. 5 is the fact that the PI edge 122 is also the point where the conductive traces 130, 131, 132, and 133 also terminate at their "beam ends" 135, 136, 137, and 138, respectively. By terminating the conductive traces 130–133 along the same line as the PI edge 122, when viewed from above (as in FIG. 4), unsupported lead beams are eliminated, and therefore, the conductive traces will not be bent during or after the manufacturing operation of the TAB circuit. This is a significant improvement, since the end portions of the conductive traces 130–133 will always become registered in the correct position, so long as the registration mark 124 is placed in the proper position when it is time to mate the TAB circuit 100 to a heater chip and the mask is true.

FIG. 5 also shows the edge 140 of the covercoat, and shows the variations in the shape of the covercoat at 142, where the covercoat must travel over the conductive traces, such as the trace 131. The tolerance of the covercoat edge location at 140 is controlled from the PI edge 122, as noted above. In the prior art of FIG. 2, the covercoat edge 70 may have been referenced to the PI edge 52, however, that would not be with any reference to the ends 65–68 of the conductive traces or lead beam ends 60–63. Moreover, the prior art covercoat edge 70 was far removed from the lead beam ends 65–68, so these traces 60–63 were always exposed before encapsulation.

In the new design of FIG. 5, the conductive traces 130–133 terminate in their beam ends 135–138 along virtually the same line as the PI edge 122. In this manner, the distance between the beam ends 135–138 to the covercoat edge 140 is fairly tightly controlled, which will do a lot to increase the likelihood that corrosive ink will not get into the conductive traces, and thereby prevent this source of potential corrosion of these traces.

By use of the extended PI edge 122, which covers both the traditional conductive traces and also fills the regions between the conductive traces 130–133, the area between the conductive traces becomes filled with the covercoat material at the area designated by the reference numeral 146 on FIG. 5. In addition, the area between the conductive traces that is also between the covercoat edge 140 and the PI edge 122 is traditionally free of any excess polyimide material, metal, or covercoat materials, and typically is unused in TAB circuit and heater chip designs. The new TAB circuit 100 of the present invention utilizes this area that is essentially "clean" as a "support web" that allows alternative assembly methods to be employed in the alignment and bonding of the TAB circuit to the heater chip. An example of this support web area is designated at the reference numeral 148 on FIGS. 5 and 6.

Figure 6:
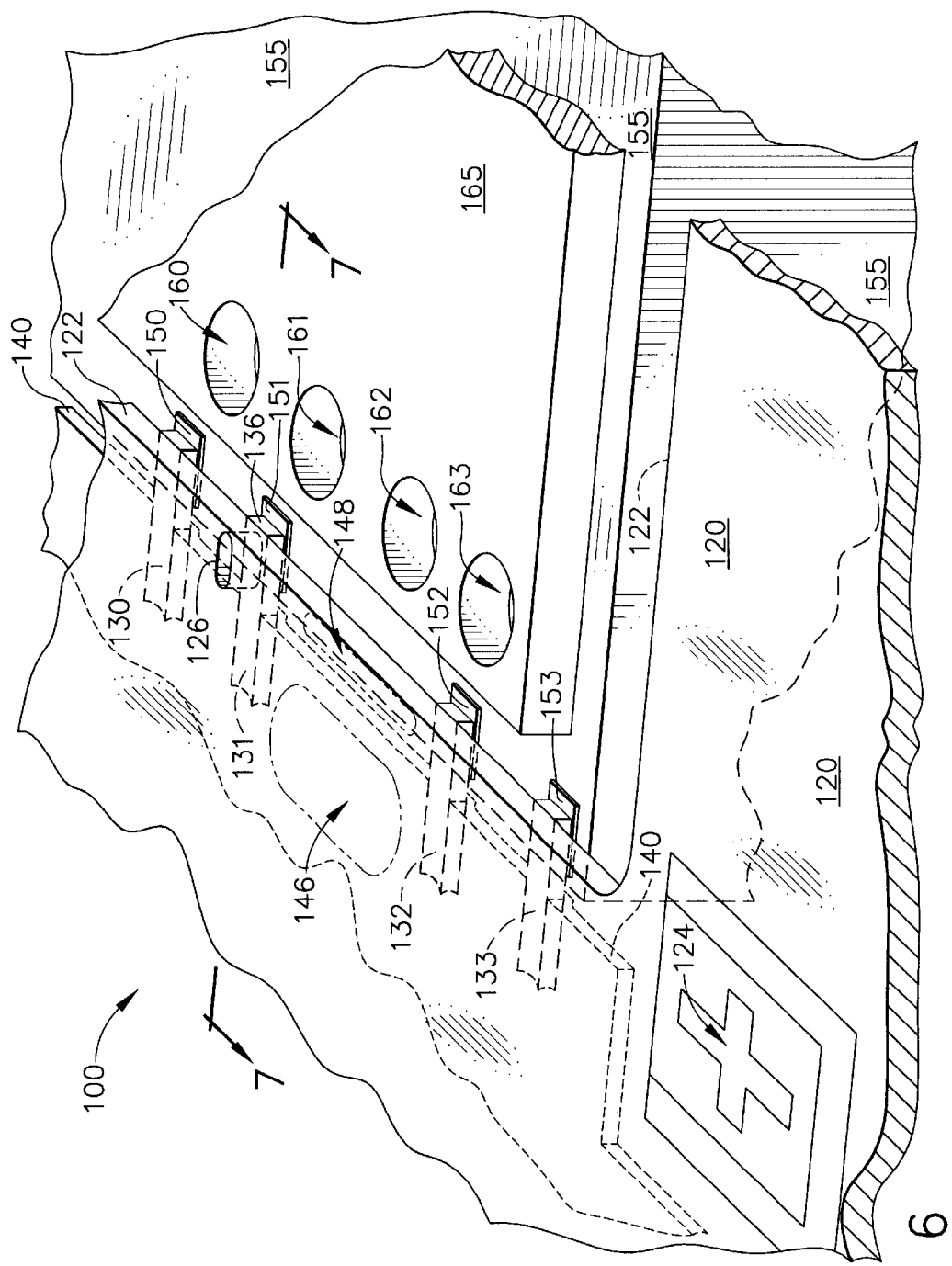
FIG. 6 is a perspective view of the TAB circuit of FIG. 5, showing a later assembly stage of the circuit after it has been assembled to a heater chip and nozzle plate, with the lead beam ends assembled to bonding pads of the heater chip.

FIG. 6 illustrates a further step in the manufacturing process using the TAB circuit 100 of the present invention, as it is mated to a heater chip 155. The bonding pads are illustrated for heater chip 155, at the reference numerals 150, 151, 152, and 153. These bonding pads 150–153 match up respectively to the electrical traces 130–133 of the TAB circuit 100. It is apparent from comparing FIGS. 3 and 6 that, although the heater chip did not change in dimensions, the location of the PI edge has changed with respect to the heater chip. On FIG. 3, the PI edge 52 was separated by a significant distance from the edge of the heater chip 85. This was an open distance, through which the unsupported ends of the electrical traces 60–63 had to travel before terminating at their bonding points on the bond pads 80–83 of the heater chip 85.

On FIG. 6, to the contrary the PI edge 122 is in close proximity to the heater chip 155, and in fact overlaps the outer edge of heater chip 155. The bonding pads 150–153 can be placed in precisely the same locations on the heater chip 155 as compared to the bonding pads 80–83 of the heater chip 85. However, in FIG. 6, the metal traces 130–133 are brought to positions in close proximity to mate to these bonding pads 150–153, but there are no unsupported leads or beam ends of these traces. Instead, a smaller chip window 144 is formed by extending the polyimide material of the TAB circuit at 120 all the way to this new location for the PI edge 122, thereby overlapping a portion of the outer edge of the heater chip 155.

Since it is preferred to thermosonically bond or weld the metal traces 130–133 to the bonding pads 150 through 153, it is also preferred to provide openings such as the opening 126, viewable on FIG. 6. This opening 126 allows the thermosonic bonding tool to place a "welding" rod directly onto the metal lead 131, and thereby cause the thermosonic welding to take place between the metal trace 131 and the bonding pad 151. Openings such as the one at 126 on FIG. 6 were not needed in the prior art design illustrated in FIG. 3, since the ends of the traces or leads 60–63 were already exposed from above, and therefore, the thermosonic bonding instrument could provide rods directly to those upper surfaces of these leads. Of course, leads 60–63 were also vulnerable to being bent due to their open nature.

A nozzle plate 165 is still placed on top of the heater chip 155, in a similar fashion to the nozzle plate 95 of FIG. 3 that is placed atop the heater chip 85. In FIG. 6, the nozzle plate 165 provides multiple openings through which a droplet of ink is discharged when the heater element (typically a thin film resistor) is energized electrically. The nozzle openings on FIG. 6 are designated by the reference numerals 160, 161, 162, and 163. These nozzle openings or orifices 160–163 would typically be associated with heater resistors (not shown on FIG. 6) that are electrically energized through the circuit pathways 130–133 and bonding pads 150–153, respectively.

The "support web" area 148 is also illustrated on FIG. 6. By having such PI support web areas, specific locations can be provided between the lead beams 130–133 (and other lead beams at further locations of the TAB circuit not viewable on FIG. 6) where a drop of curable epoxy can be applied to tack the TAB circuit 100 to the heater chip 155 prior to being thermosonically bonded. The tacked subassembly (i.e., the combination of the TAB circuit 100 and the heater chip 155) can then be transferred to a standard bonding machine for thermosonic welding or bonding. The ability to perform the tacking procedure to initially hold the TAB circuit to the heater chip allows for a faster overall TAB bonding process when compared to the current sequential process that is used to first align the individual unsupported leads, and then immediately bond the entire TAB circuit lead beams to the heater chip.

The new assembly procedure that can be implemented by use of the TAB circuit design of the present invention allows for a separation of the manufacturing steps for first aligning the circuits, and then bonding thermosonically the TAB circuit to the heater chip. Since these manufacturing steps can be separated, it becomes possible to perform parallel processing, which will reduce the overall cycle time by approximately half for manufacturing this portion of the ink jet cartridge. Moreover, the VLL inspection step for individual lead beams can be eliminated altogether, as it is no longer necessary for properly performing the thermosonic welding procedure.

Figure 7:
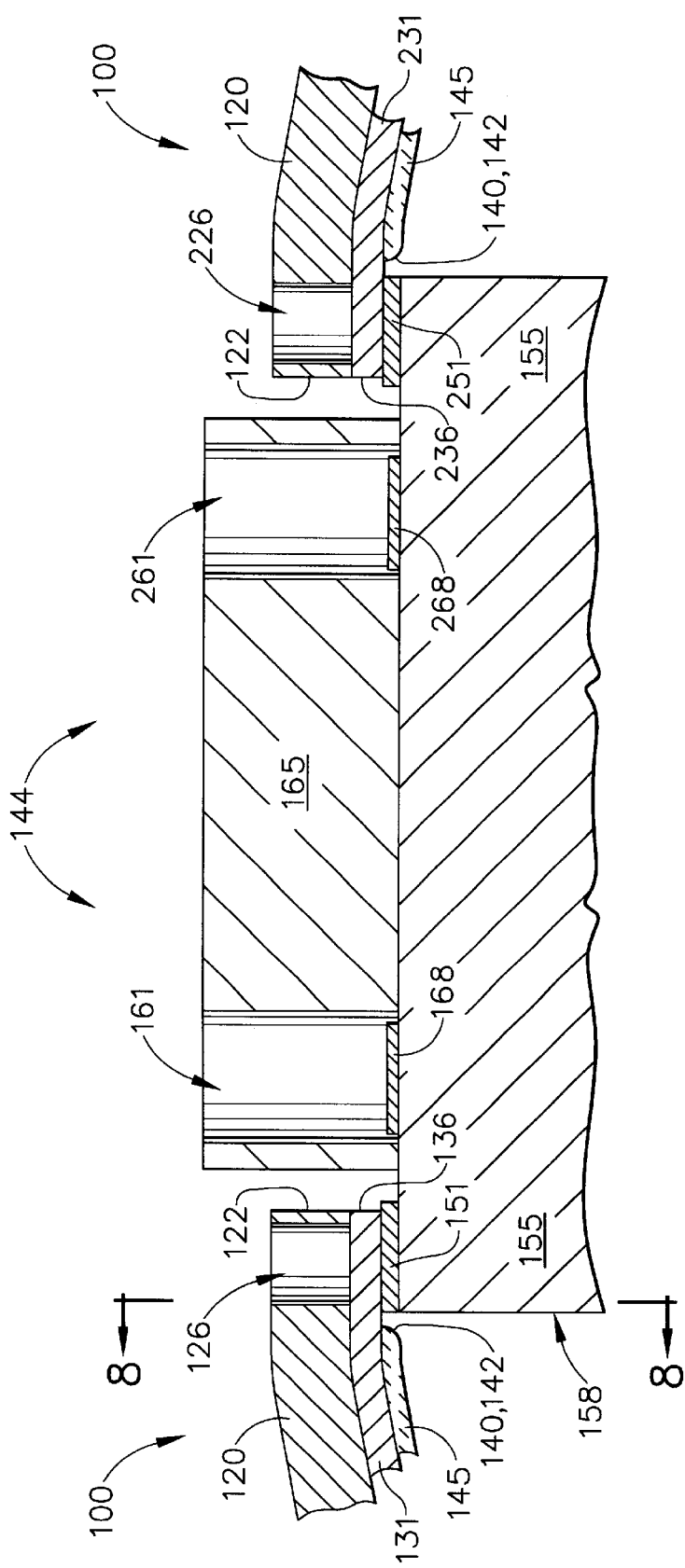
FIG. 7 is an elevational view in cross-section of a portion of the TAB circuit and heater chip of FIG. 6, taken along the line 7—7.

FIG. 7 illustrates a cross-section of a portion of the heater chip 155, nozzle plate 165, and the TAB circuit 100. With the heater chip 155 at the center of the view, the nozzle plate 165 is also centered in this view. One of the nozzle openings or orifices 161 is illustrated along the left portion of FIG. 7, and at the bottom of this nozzle opening 161 is a heating element or heater resistor 168. A similar nozzle opening 261 with associated heater resistor 268 are illustrated along the right portion of FIG. 7. As described above, when the heating element (which typically is a thin film resistor) is electrically energized, it generates enough heat to cause a droplet of ink to be spurted out through the nozzle opening.

Some of the details of the orientation between the TAB circuit and the heater chip are provided on FIG. 7. While inspecting the left-hand portion of FIG. 7, the TAB circuit arrives from the left with the polyimide material layer 120 at the top, a conductive trace 131 in the middle and the covercoat layer 145 at the bottom. As can be seen on FIG. 7, the covercoat material terminates at 142 just before reaching the vertical edge 158 of the heater chip 155. A small opening or "window" at 126 is made through the polyimide material of the layer 122 to allow the thermosonic probe or rod to come down and make contact against the metal trace 131 at the time that it is to be thermosonically bonded or welded to the bonding pad 151 of the heater chip. As can be seen in FIG. 7, the PI edge 122 is in very close vertical alignment with the beam end 136 of the metal conductive trace 131. It is preferred that these two edges 122 and 136 be perfectly aligned, however, it is not entirely necessary, nor is it always achievable.

If the TAB circuit is first electroplated while the shorting bar is still in position, then it could be possible to use some type of mechanical punch to push down and create the chip window or opening 144, and thereby punch through both the PI layer 120 and the conductive traces (such as the trace 131), all in one step. In that situation, the PI edge 122 and the lead beam end 136 of the conductive trace 131 would then be in almost perfect alignment. However, it may be preferred to use more conventional manufacturing methodologies that are already in place for conventional TAB circuits. In that situation, the TAB circuit polyimide material layer 120 could be etched away or otherwise cut away, while leaving the conductive traces 131 (and other such traces) intact. Then these metal traces could themselves be etched away or cut away by a second process.

It will be understood that the shorting bar (not shown) would typically be in the middle of the opening 144 of the TAB circuit, and initially would be connected to all of the metal traces, such as the traces 130–133. After the electroplating process is completed to thicken the amount of metallic material on each of these traces, then it would be possible to eliminate the shorting bar and other unnecessary circuit traces to create the chip window 144.

Arriving from the right-hand side of FIG. 7 is another portion of the TAB circuit 100, having a similar structure. The polyimide layer 120 is on the top portion of the TAB circuit, and a different electrically conductive trace 231 makes up the middle layer. The covercoat 145 makes up the bottom layer of the TAB circuit up until it terminates at its edge 142. It will be understood that the covercoat edge 142 is roughly rectangular in shape and usually completely surrounds the chip window 144 of the TAB circuit 100.

A small window or opening 226 is made through the polyimide layer 120 of the right-hand portion of TAB circuit 100 to allow a thermosonic probe or rod to be placed against the metal trace 231 for the thermosonic welding process. The end portion of the metal trace 231 is placed into contact with the bonding pad at 251, such that the thermosonic weld can take place between these two metallic members. The "lead beam end" of the metal trace 231 is located at the reference numeral 236, and this will preferably match up fairly precisely with the PI edge 122 in the vertical direction, as seen on FIG. 7. It will be understood that the PI edge 122 forms a rectangularly-shaped window or opening that defines the chip window 144, and this PI edge 122 will preferably match up within a predetermined tolerance to the physical end of each of the conductive traces that run to the chip window to be bonded to the heater chip 155.

Figure 8:
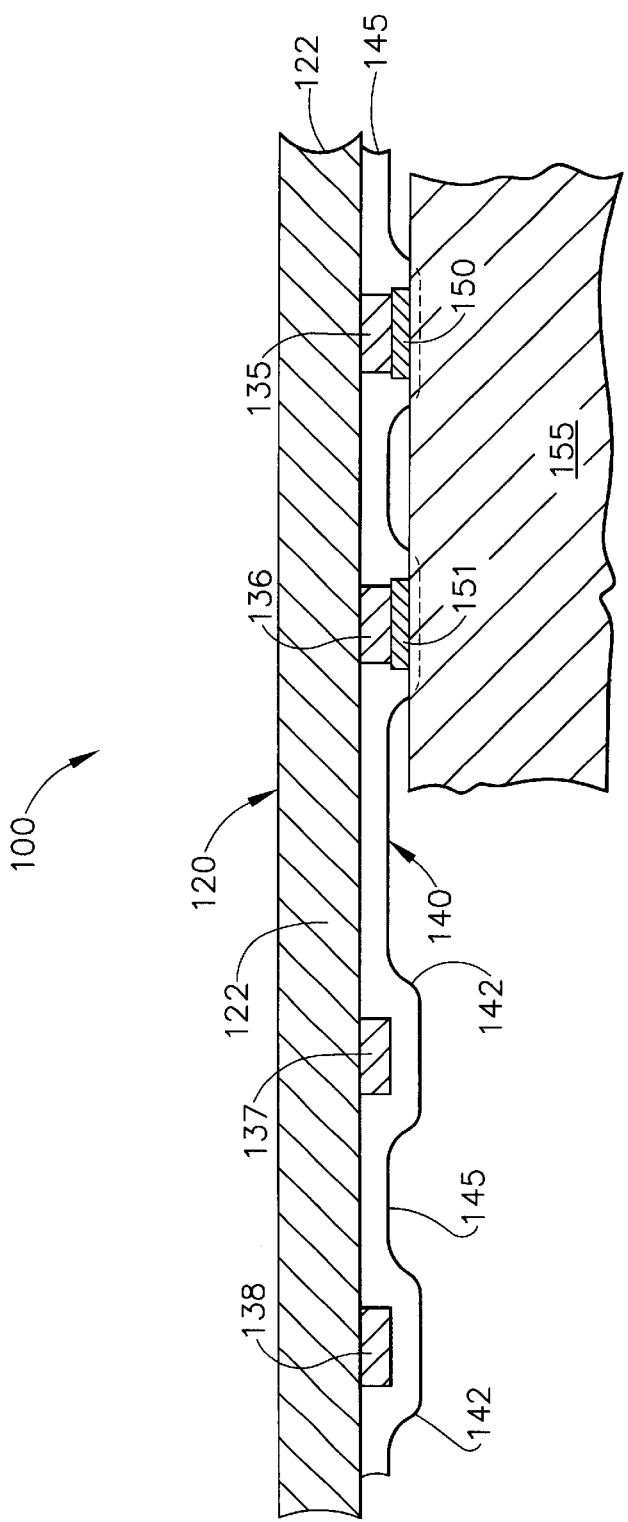
FIG. 8 is an elevational view in cross-section of a portion of the TAB circuit and heater chip of FIG. 7, taken along the line 8—8.

FIG. 8 is another cross-section view of a portion of the TAB circuit 100 at a location along the PI edge 122, near the heater chip 155. In the view of FIG. 8, the polyimide layer 120 again comprises the top layer of the TAB circuit 100, and metal circuit traces 135–138 make up a middle layer (at certain locations). The bottom layer is the covercoat layer 145, which includes the covercoat edge 140, including where it extends to a further thickness at 142 to encompass the metal traces (e.g., metal traces 137 and 138).

The metal traces 135 and 136 are illustrated as being in contact with bonding pads 150 and 151, respectively. These bonding pads typically are in electrical communication with other circuit traces (not shown) of the heater chip that will carry electrical current to the heating elements or heating resistors (also not shown in FIG. 8), such as the heater resistors 168 and 268 illustrated in FIG. 7.

After the thermosonic welding step has bonded the lead beam ends to the bonding pads, an encapsulating compound can be applied to locations along the chip window opening 144 and also along the edge of the heater chip, including along the support web 148. This encapsulation will tend to prevent corrosive ink from contacting the circuit traces.

Conclusion

By use of the principles of the present invention, the TAB circuit 100 solves certain manufacturing problems by eliminating yield production due to bent inner lead beams, and also by eliminating the need to closely inspect the inner lead beams. It also solves certain manufacturing problems at the time the TAB circuit is assembled to the heater chip. This includes eliminating the bent inner lead beams that would otherwise reject a TAB circuit that is about to be bonded to the heater chip. The need to perform the Video Lead Locator (VLL) Inspection at the TAB bond is also eliminated, which reduces cycle time, and in some cases results in a cycle time improvement of at least 3 seconds per TAB circuit assembly. The present invention also eliminates the variation of the lead beam alignment to the heater chip bond pads, which also allows the TAB bond process to produce more consistent bond strength. The present invention will also eliminate a failure mode known as "lifted lead beam," which can occur when a single bond breaks at the interface between one of the inner lead beams and a contact pad on the heater chip.

The present invention also allows for an alternative method to align and assemble the TAB tape circuit to the heater chip. As discussed above, one alternative methodology could be to initially tack the TAB circuit and heater chip together using epoxy or some other adhesive before the step of thermosonic welding or bonding. Once the tacking procedure has occurred, the thermosonic welding/bonding procedure can be performed at any later time, thereby separating the alignment and assembly processes. Furthermore, these two processes can then be run in parallel.

The present invention also eliminates other manufacturing assembly problems, by reducing the number of electrical failures due to broken inner lead beam bonds to the heater chip, and by reducing the ability of the heater chip to shift out of alignment during the assembly of the TAB circuit and the heater chip to the "ink bottle" of the ink jet cartridge. Moreover, the present invention allows for a more robust encapsulation of the TAB circuit and heater chip assembly.

Another problem solved is in product performance, in which the present invention reduces the egression of ink from the nozzle holes onto the metal layers or traces on the heater chip. By preventing this ink egression onto the metal layers that could otherwise be corroded, the present invention reduces metal corrosion on both the heater chip and on the TAB circuit itself. This is accomplished in part due to the smaller dimension between the covercoat edge 140 and the outer edge of the heater chip at 158 (see FIG. 7). This provides a much smaller volume or area that needs to be filled with some type of epoxy or other sealant or filler material to help prevent the corrosive ink particles from getting into the metallic portions of the TAB circuit and heater chip.

It will be understood that the shape and dimensions of the TAB circuit disclosed above can be significantly modified without departing from the principles of the present invention. Certainly the number, shape, and directions of the electrical traces could be so modified, especially as various ink jet cartridges use different numbers of nozzles, and therefore require different numbers of electrical signals. This variation is not only between manufacturer to manufacturer, but also between different ink jet printer models produced by a single manufacturer.

It will also be understood that the materials used in today's TAB circuits, as disclosed above, could significantly change over time, without departing from the principles of the present invention. Certainly improvements in insulative and conductive compounds are envisioned by the inventors.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A tape automated bonding circuit for a printer cartridge, comprising:

a flexible substrate having a first surface and a second surface and comprised of electrically insulating material; a plurality of electrically conductive traces affixed to said first surface of the flexible substrate;

wherein said flexible substrate includes a chip window opening that is formed between said first and second surfaces by an internal edge in said flexible substrate that defines a closed perimeter; and wherein at least a subset of said plurality of electrically conductive traces forms pathways that terminate substantially adjacent to said internal edge; and a covercoat layer of electrically insulative material that is formed on the first surface of said flexible substrate, said covercoat layer having an edge boundary proximal to, but not touching, said internal edge of said flexible substrate; and wherein a position of said covercoat edge boundary is determined in reference to a position of said internal edge of said flexible substrate.

2. A tape automated bonding circuit for a printer cartridge, comprising:

a flexible substrate having first surface and a second surface and comprised of electrically insulating material; a plurality of electrically conductive traces affixed to said first surface of the flexible substrate;

wherein said flexible substrate includes a chip window opening that is formed between said first and second surfaces by an internal edge in said flexible substrate that defines a closed perimeter; and wherein at least a subset of said plurality of electrically conductive traces forms pathways that terminate substantially adjacent to aid internal edge;

a plurality of bond pads along at least one edge of a heater chip, said heater chip containing a plurality of resistive heating elements;

wherein an inner dimension formed by at least one of a length or a width of said chip window is smaller in linear distance than an outer dimension formed by at least one of a length or a width of a surface of said heater chip;

wherein the end of the pathways of said at least a subset of said plurality of electrically conductive traces comes into close proximity to the plurality of bond pads along said at least one edge of the heater chip, such that portion of said flexible substrate overlaps a portion of said surface of the heater chip along said at least one edge of the heater chip; and wherein said flexible substrate exhibits a plurality of openings in its second surface proximal to the termination of said at least a subset of said plurality of electrically conductive traces, which openings are used for a thermosonic welding procedure.

3. A tape automated bonding circuit for a printer cartridge, comprising:

a flexible substrate having a first surface and a second surface and comprised of electrically insulating material; a plurality of electrically conductive traces affixed to said first surface of the flexible substrate;

wherein said flexible substrate includes a chip window opening that is formed between said first and second surfaces by an internal edge in said flexible substrate that defines a closed perimeter; and wherein at least a subset of said plurality of electrically conductive traces forms pathways that terminate substantially adjacent to said internal edge;

a plurality of bond pads along at least one edge of a heater chip, said heater chip containing a plurality of resistive heating elements;

wherein an inner dimension formed by at least one of a length or a width of said chip window is smaller in linear distance than an outer dimension formed by at least one of a length or a width of a surface of said heater chip;

wherein the end of the pathways of said at least a subset of said plurality of electrically conductive traces comes into close proximity to the plurality of bond pads along said at least one edge of the heater chip, such that portion of said flexible substrate overlaps a portion of said surface of the heater chip along said at least one edge of the heater chip; and wherein a portion of the area of said first surface between at least two of said at least a subset of said plurality of electrically conductive traces creates a support web proximal to said internal edge of said flexible substrate, said support web being useful for alternative assembly procedures.

4. A method for assembling a tape automated bonding circuit used in a printer cartridge, said method comprising:

(a) providing a flexible substrate comprised of electrically insulating material, and a plurality of electrically conductive traces affixed to a first surface of the flexible substrate; wherein said flexible substrate includes a chip window opening that is formed in said first surface by an internal edge in said flexible substrate that defines a closed perimeter; and wherein at least a subset of said plurality of electrically conductive traces forms pathways that terminate substantially adjacent to said internal edge;

(b) providing a heater chip that exhibits a plurality of bond pads along at least one edge of said heater chip, said heater chip containing a plurality of resistive heating elements; wherein an inner dimension formed by at least one of a length or a width of said chip window is smaller in linear distance than an outer dimension formed by at least one of a length or a width of a surface of said heater chip;

(c) aligning said heater chip and said flexible substrate without the use of a video lead locator inspection tool to detect bent leads, so that the end of the pathways of said at least a subset of said plurality of electrically conductive traces comes into close proximity to the plurality of bond pads along said at least one edge of the heater chip, such that a portion of said flexible substrate overlaps a portion of said surface of the heater chip along said at least one edge of the heater chip;

(d) bonding said plurality of bond pads to corresponding one of said at least a subset of said plurality of electrically conductive traces; and (e) applying a layer of covercoat material to a first surface of said flexible substrate, wherein a location of an edge boundary of said covercoat material layer is determined using a tolerance with reference to said internal edge in said flexible substrate, and therefore said covercoat material layer edge is also controlled with respect to termination locations of said at least a subset of said plurality of electrically conductive traces.

5. The method as recited in claim 4, further comprising the step of: attaching a nozzle plate to a surface of said heater chip while aligning a plurality of nozzle openings in said nozzle plate with a position of said plurality of resistive heating elements.

6. A method for assembling a tape automated bonding circuit used in a printer cartridge, said method comprising:

(a) providing a flexible substrate comprised of electrically insulating material, and a plurality of electrically conductive traces affixed to a first surface of the flexible substrate; wherein said flexible substrate includes a chip window opening that is formed in said first surface by an internal edge in said flexible substrate that defines a closed perimeter; and wherein at least a subset of said plurality of electrically conductive traces forms pathways that terminate substantially adjacent to said internal edge;

(b) providing a heater chip that exhibits a plurality of bond pads along at least one edge of said heater chip, said heater chip containing a plurality of resistive heating elements; wherein an inner dimension formed by at least one of a length or a width of said chip window is smaller in linear distance than an outer dimension formed by at least one of a length or a width of a surface of said heater chip;

(c) aligning said heater chip and said flexible substrate without the use of a video lead locator inspection tool to detect bent leads, so that the end of the pathways of said at least a subset of said plurality of electrically conductive traces comes into close proximity to the plurality of bond pads along said at least one edge of the heater chip, such that a portion of said flexible substrate overlaps a portion of said surface of the heater chip along said at least one edge of the heater chip; and (d) bonding said plurality of bond pads to corresponding one of said at least a subset of said plurality of electrically conductive traces, said bonding step being performed by a thermosonic welding procedure using a plurality of openings in a second surface of said flexible substrate that are positioned in alignment with termination locations of said at least a subset of said plurality of electrically conductive traces.

7. A method for assembling a tape automated bonding circuit used in a printer cartridge, said method comprising:

(a) providing a flexible substrate comprised of electrically insulating material, and a plurality of electrically conductive traces affixed to a first surface of the flexible substrate; wherein said flexible substrate includes a chip window opening that is formed in said first surface by an internal edge in said flexible substrate that defines a closed perimeter; and wherein at least a subset of said plurality of electrically conductive traces forms pathways that terminate substantially adjacent to said internal edge;

(b) providing a heater chip that exhibits a plurality of bond pads along at least one edge of said heater chip, said heater chip containing a plurality of resistive heating elements; wherein an inner dimension formed by at least one of a length or a width of said chip window is smaller in linear distance than an outer dimension formed by at least one of a length or a width of a surface of said heater chip;

(c) aligning said heater chip and said flexible substrate without the use of a video lead locator inspection tool to detect bent leads, so that the end of the pathways of said at least a subset of said plurality of electrically conductive traces comes into close proximity to the plurality of bond pads along said at least one edge of the heater chip, such that a portion of said flexible substrate overlaps a portion of said surface of the heater chip along said at least one edge of the heater chip;

(d) bonding said plurality of bond pads to corresponding one of said at least a subset of said plurality of electrically conductive traces; and (e) attaching a nozzle plate to a surface of said heater chip while aligning a plurality of nozzle openings in said nozzle plate with a position of said plurality of resistive heating elements;

wherein a portion of the area of said first surface between at least two of said at least a subset of said plurality of electrically conductive traces creates a support web proximal to said internal edge of said flexible substrate that tends to prevent ink from entering areas near said electrically conductive traces.

8. The method as recited in claim 7, further comprising the step of: applying an encapsulating compound at locations along said chip window opening and said at least one edge of said heater chip, including locations proximal to said support web, wherein said encapsulating compound further prevents ink from entering areas near said electrically conductive traces.

9. A method for partially assembling a tape automated bonding circuit used in a printer cartridge, said method comprising:

(a) providing a flexible substrate comprised of electrically insulating material, and a plurality of electrically conductive traces affixed to a first surface of the flexible substrate; wherein said flexible substrate includes a chip window opening that is formed in said first surface by an internal edge in said flexible substrate that defines a closed perimeter; and wherein at least a subset of said plurality of electrically conductive traces forms pathways that terminate substantially adjacent to said internal edge;

(b) providing a heater chip that exhibits a plurality of bond pads along at least one edge of said heater chip, said heater chip containing a plurality of resistive heating elements; wherein an inner dimension formed by at least one of a length or a width of said chip window is smaller in linear distance than an outer dimension formed by at least one of a length or a width of a surface of said heater chip;

(c) aligning said heater chip and said flexible substrate without the use of a video lead locator inspection tool to detect bent leads, so that the end of the pathways of said at least a subset of said plurality of electrically conductive traces comes into close proximity to the plurality of bond pads along said at least one edge of the heater chip, such that a portion of said flexible substrate overlaps a portion of said surface of the heater chip along said at least one edge of the heater chip; and (d) applying an adhesive material between said flexible substrate and said heater chip at locations in a support web area of the flexible substrate where it overlaps at least a portion of said surface of the heater chip along said at least one edge of the heater chip, thereby tacking said flexible substrate to said heater chip in an aligned position to thereby create a sub-assembly that can be permanently electrically connected in a subsequent procedure.

10. The method as recited in claim 9, wherein said support web area comprises a portion of the area of said first surface between at least two of said at least a subset of said plurality of electrically conductive traces that is proximal to said internal edge of said flexible substrate, wherein said support web area tends to prevent ink from entering areas near said electrically conductive traces.

11. The method as recited in claim 10, further comprising the step of: thermosonically welding said bond pads of the heater chip and said termination locations of said at least a subset of said plurality of electrically conductive traces, thereby creating a permanent assembly.

12. The method as recited in claim 11, further comprising the step of: applying an encapsulating compound at locations along said chip window opening and said at least one edge of said heater chip, including locations proximal to said support web area, wherein said encapsulating compound further prevents ink from entering areas near said electrically conductive traces.

13. The method as recited in claim 9, further comprising the step of: thermosonically welding said bond pads of the heater chip and said termination locations of said at least a subset of said plurality of electrically conductive traces, thereby creating a permanent assembly.

14. The method as recited in claim 13, wherein the welding step is performed without use of any video lead locator inspection procedure.

* * * * *

UNITED STATES PATENT AND TRADEMARK OFFICE
CERTIFICATE OF CORRECTION

PATENT NO.     : 6,619,786 B2
DATED          : September 16, 2003
INVENTOR(S)    : Brian Lee Cobb et al.

It is certified that error appears in the above-identified patent and that said Letters Patent is hereby corrected as shown below:

Column 12,
Line 51, before "first" insert -- a --.

Column 13,
Lines 8 and 42, before "portion of said flexible substrate" insert -- a --.

Column 14,
Lines 14 and 60, before "corresponding" insert -- a --.

Column 15,
Line 30, before "corresponding" insert -- a --.

Signed and Sealed this

Seventeenth Day of February, 2004

JON W. DUDAS
*Acting Director of the United States Patent and Trademark Office*